(12) United States Patent
Lee

(10) Patent No.: US 7,711,969 B2
(45) Date of Patent: May 4, 2010

(54) APPARATUS AND METHOD FOR CONTROLLING ACTIVE CYCLE OF SEMICONDUCTOR MEMORY APPARATUS

(75) Inventor: Sang-Kwon Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 695 days.

(21) Appl. No.: 11/600,156

(22) Filed: Nov. 16, 2006

(65) Prior Publication Data

US 2007/0150769 A1 Jun. 28, 2007

(30) Foreign Application Priority Data

Dec. 27, 2005 (KR) ...................... 10-2005-0130343

(51) Int. Cl.
*G06F 1/00* (2006.01)
*H03K 19/00* (2006.01)

(52) U.S. Cl. ............................ 713/322; 326/16; 326/93

(58) Field of Classification Search ................... 713/322
See application file for complete search history.

(56) References Cited

U.S. PATENT DOCUMENTS

| | | | |
|---|---|---|---|
| 5,113,093 A * | 5/1992 | Tashiro et al. ................. | 326/16 |
| 5,206,830 A | 4/1993 | Isobe et al. | |
| 6,456,561 B2 * | 9/2002 | Maeda .................... | 365/189.05 |
| 6,615,291 B1 * | 9/2003 | Kamei et al. ................... | 710/22 |
| 6,738,308 B2 * | 5/2004 | Charlier et al. .......... | 365/233.1 |
| 6,801,468 B1 | 10/2004 | Lee | |
| 6,862,247 B2 | 3/2005 | Yamazaki | |
| 2005/0226090 A1 | 10/2005 | Lee | |
| 2005/0232065 A1 | 10/2005 | Jeong | |

FOREIGN PATENT DOCUMENTS

| | | | |
|---|---|---|---|
| EP | 1229549 A1 * | 8/2002 | |
| JP | 2002312232 | 10/2002 | |
| JP | 2005108301 | 4/2005 | |

\* cited by examiner

*Primary Examiner*—Suresh K Suryawanshi
(74) *Attorney, Agent, or Firm*—Venable LLP; Jeffri A. Kaminski

(57) ABSTRACT

An apparatus for controlling an active cycle of semiconductor memory that supports a synchronous mode and an asynchronous mode is provided. The apparatus includes an operational mode control unit that determines the operational mode of the semiconductor memory on the basis of a clock signal for a predetermined time and outputs an operational mode determination signal, and an active control unit that controls the output of an active signal for executing an active cycle of the corresponding operational mode on the basis of the operational mode determination signal.

26 Claims, 6 Drawing Sheets

APPARATUS AND METHOD FOR CONTROLLING ACTIVE CYCLE OF SEMICONDUCTOR MEMORY APPARATUS

BACKGROUND

1. Technical Field

The present invention relates to semiconductor memory apparatus, and more particularly, to an apparatus and method for controlling an active cycle of semiconductor memory apparatus.

2. Related Art

FIG. 1 shows the configuration of an apparatus for controlling an active cycle of semiconductor memory apparatus, particularly, a synchronous semiconductor memory apparatus supporting an asynchronous mode, according to the related art.

The apparatus includes a first pulse generating unit 11 to which a chip selection signal CS is input, a first transistor M1 that has a source connected to a power supply terminal and a gate connected to an output terminal of the first pulse generating unit 11, a first inverter IV1 that includes second and third transistors M2 and M3 having gates to which a clock signal CLK is input and is connected between the first transistor M1 and a ground terminal, a first latch 12 that is connected to an output terminal of the first inverter IV1, a second inverter IV2 that is connected to an output terminal of the first latch 12, a second pulse generating unit 13 that is connected to an output terminal of the second inverter IV2, a first NAND gate ND1 to which the clock signal CLK and an active address ADV are input, a third pulse generating unit 14 to which the output of the first NAND gate ND1 is input, a fourth pulse generating unit 15 to which a normal active signal N_ACT is input, a fourth transistor M4 that has a gate to which the output of the second pulse generating unit 13 is input and a source connected to the ground terminal, a fifth transistor M5 that has a gate to which the output of the third pulse generating unit 14 is input, a source connected to the ground terminal, and a drain connected to the drain of the fourth transistor M4, a third inverter IV3 that includes two transistors having gates to which the output of the fourth pulse generating unit 15 is input and is connected to the power supply terminal and the drain of the fourth transistor M4, a second latch 16 that is connected to an output terminal of the third inverter IV3, a fourth inverter IV4 to which a pre-charge signal PCG is input, an eighth transistor M8 that has a source connected to the power supply terminal and a gate to which the output of the fourth inverter IV4 is input, a ninth transistor M9 that has a drain connected to the eighth transistor M8, a gate to which a delayed normal active signal N_ACTd is input, and a source connected to the ground terminal, a third latch 17 that is connected to a connection node of the eighth transistor M8 and the ninth transistor M9, a fifth inverter IV5 that is connected to an output terminal of the third latch 17, a second NAND gate ND2 to which the output of the fifth inverter IV5 and the output of the second latch 16 are input, a sixth inverter IV6 to which the output of the second NAND gate ND2 is input, and a delay element 18 that receives the output of the sixth inverter IV6 and outputs a row active signal R_ACT and the delayed normal active signal N_ACTd.

When high-level signals are input, the first and fourth pulse generating units 11 and 15 generate low pulses. When a high-level signal is input, the second pulse generating unit 13 generates a high pulse. When a low-level signal is input, the third pulse generating unit 14 generates a high pulse.

The first to third latches 12, 16, and 17 each include two inverters that invert input signals, output the inverted signals, and feed back the output signal to the input terminals thereof.

Next, the operation of the apparatus for controlling an active cycle of a semiconductor memory apparatus according to the related art will be described with reference to FIGS. 1 and 2.

When the chip selection signal CS is enabled, that is, turns to a high level, as shown in FIG. 2, the first pulse generating unit 11 generates a low pulse to cause the first transistor M1 to be turned on.

When the clock signal CLK is at the low level, as shown in FIG. 2, a high-level signal is output from the first inverter IV1, and the operational mode determination signal MIX_CON is enabled, that is, turns to a high level through the first latch 12 and the second inverter IV2.

The semiconductor memory apparatus according to the related art supports an asynchronous mode. Therefore, once the chip selection signal CS is enabled, the operational mode determination signal MIX_CON is enabled, that is, turns to a high level to execute the asynchronous mode regardless of the input of the clock signal CLK.

The enabled operational mode determination signal MIX_CON causes a ready signal READY to be enabled, that is, to turn to a high level, as shown in FIG. 2.

Since the operational mode determination signal MIX_CON is at the high level, the second pulse generating unit 13 generates a high pulse, which causes the fourth transistor M4 to be turned on. At that time, since the normal active signal N_ACT is disabled, that is, the normal active signal N_ACT is at a low level, the fourth pulse generating unit 15 outputs a high-level signal, and thus the third inverter IV3 outputs a low-level signal, which causes the ready signal READY from the second latch 16 to be enabled, that is, to turn to a high level.

The enabled ready signal READY causes the normal active signal N_ACT to be enabled, that is, to change to a high level, and thus the row active signal R_ACT and the delayed normal active signal N_ACTd are enabled, as shown in FIG. 2.

Since the ready signal READY is at the high level and PA output from the fifth inverter IV5 is also at the high level, the normal active signal N_ACT is enabled, that is, turns to a high level through the second NAND gate ND2 and the sixth inverter IV6, and the row active signal R_ACT and the delayed normal active signal N_ACTd are enabled through the delay element 18. At that time, PA turns to a high level by the pre-charge signal PCG and turns to a low level by the delayed normal active signal N_ACTd. PA is kept at the high level until an active operation is performed, as shown in FIG. 2.

When the normal active signal N_ACT is enabled, that is, turns to a high level, the ready signal READY is disabled, that is, turns to a low level, as shown in FIG. 2.

Since the normal active signal N_ACT is at the high level, the fourth pulse generating unit 15 outputs a low pulse, and thus the ready signal READY is disabled, that is, turns to a low level through the third inverter IV3 and the second latch 16.

Meanwhile, when the clock signal CLK is input, the operational mode determination signal MIX_CON is disabled, that is, turns to a low level, and a synchronous active signal CLK_ACT is enabled, that is, turns to a high level, as shown in FIG. 2.

When the clock signal CLK is toggled from the low level to the high level, the first inverter IV1 outputs a low-level signal, and the operational mode determination signal MIX_CON turns to a low level through the first latch 12 and the second inverter IV2. In addition, when the effective address ADV is enabled, that is, changes to a high level, the first NAND gate ND1 outputs a low-level signal, and the synchronous active signal CLK_ACT is enabled, that is, turns to a high level through the third pulse generating unit 14.

When the synchronous active signal CLK_ACT is enabled, that is, turns to the high level, the ready signal READY is enabled, that is, turns to a high level, and thus the pre-charge signal PCG is enabled, that is, turns to a high level for executing pre-charging, which causes PA to turn to a high level.

When the pre-charge signal PCG turns to the high level, the eighth transistor M8 is turned on, which causes PA to turn to the high level through the third latch 17 and the fifth inverter IV5.

When the ready signal READY and PA are enabled, that is, turn to the high level, the normal active signal N_ACT is enabled, that is, turns to a high level, as shown in FIG. 2.

When the normal active signal N_ACT is enabled, that is, turns to the high level, the ready signal READY is disabled, that is, turns to a low level, and the delayed normal active signal N_ACTd and the row active signal R_ACT are enabled, that is, turn to a high level, as shown in FIG. 2.

As described above, in the semiconductor memory apparatus according to the related art, two active cycles, that is, an active cycle in which the semiconductor memory apparatus is operated in the asynchronous mode at the beginning and an active cycle in which the semiconductor memory is operated in the synchronous mode in response to an input clock, are executed.

Therefore, the semiconductor memory apparatus according to the related art has a problem in that two active cycles are executed in the synchronous mode, resulting in a low operational speed and high current consumption.

SUMMARY

Embodiments of the present invention provide an apparatus and method for controlling an active cycle of semiconductor memory apparatus capable of improving an operational speed and reducing current consumption.

According to an embodiment of the present invention, there is provided an apparatus for controlling an active cycle of semiconductor memory apparatus supporting a synchronous mode and an asynchronous mode. The apparatus includes an operational mode control unit that determines the operational mode of the semiconductor memory apparatus on the basis of a clock signal for a predetermined time and outputs an operational mode determination signal, and an active control unit that controls the output of an active signal for executing an active cycle of the corresponding operational mode on the basis of the operational mode determination signal.

According to another embodiment of the present invention, there is provided a method of controlling an active cycle of semiconductor memory apparatus supporting a synchronous mode and an asynchronous mode. The method includes determining the operational mode of the semiconductor memory apparatus on the basis of a clock signal for a predetermined time and outputting an operational mode determination signal, and executing one of a synchronous active cycle and an asynchronous active cycle on the basis of the operational mode determination signal.

According to still another embodiment of the present invention, there is provided a method of controlling an active cycle of semiconductor memory apparatus supporting a synchronous mode and an asynchronous mode. The method includes when a chip selection signal is enabled, determining whether a clock signal is input, and outputting a preliminary operational mode determination signal, delaying the preliminary operational mode determination signal by a predetermined amount of time, determining whether the clock signal is input within the predetermined time, and outputting an operational mode determination signal, and executing at least one of a synchronous active cycle and an asynchronous active cycle on the basis of the operational mode determination signal.

BRIEF DESCRIPTION OF THE DRAWINGS

The above and other features and advantages of the present invention will become more apparent by describing in detail preferred embodiments thereof with reference to the attached drawings in which.

DESCRIPTION OF EXEMPLARY EMBODIMENT

Hereinafter, preferred embodiments of the invention will be described with reference to the accompanying drawings.

Figure 1:
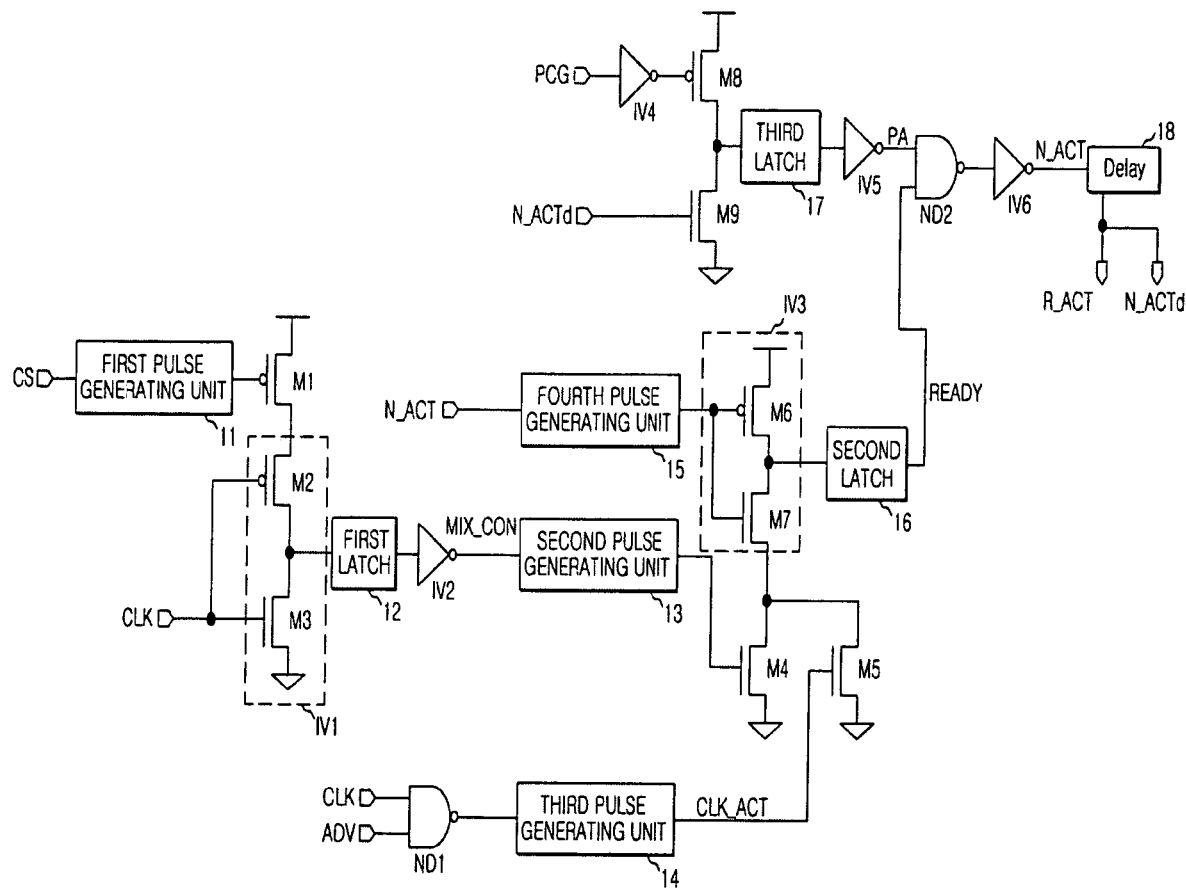
FIG. 1 is a circuit diagram illustrating the configuration of an apparatus for controlling an active cycle of semiconductor memory according to the related art.
Figure 2:
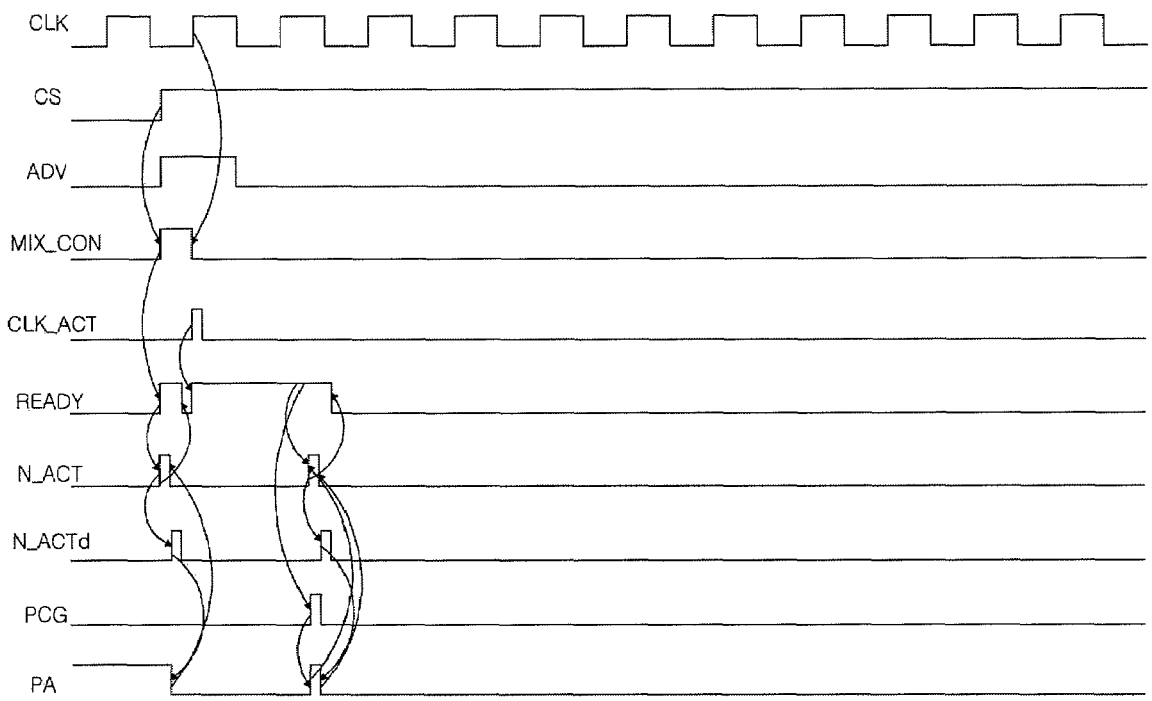
FIG. 2 is a timing chart illustrating the waveforms of signals of each component according to the related art.
Figure 3:
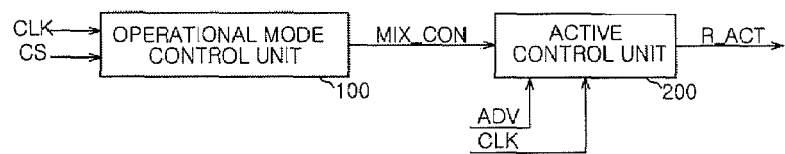
FIG. 3 is a block diagram illustrating the configuration of an apparatus for controlling an active cycle of semiconductor memory apparatus according to an embodiment of the present invention.
Figure 4:
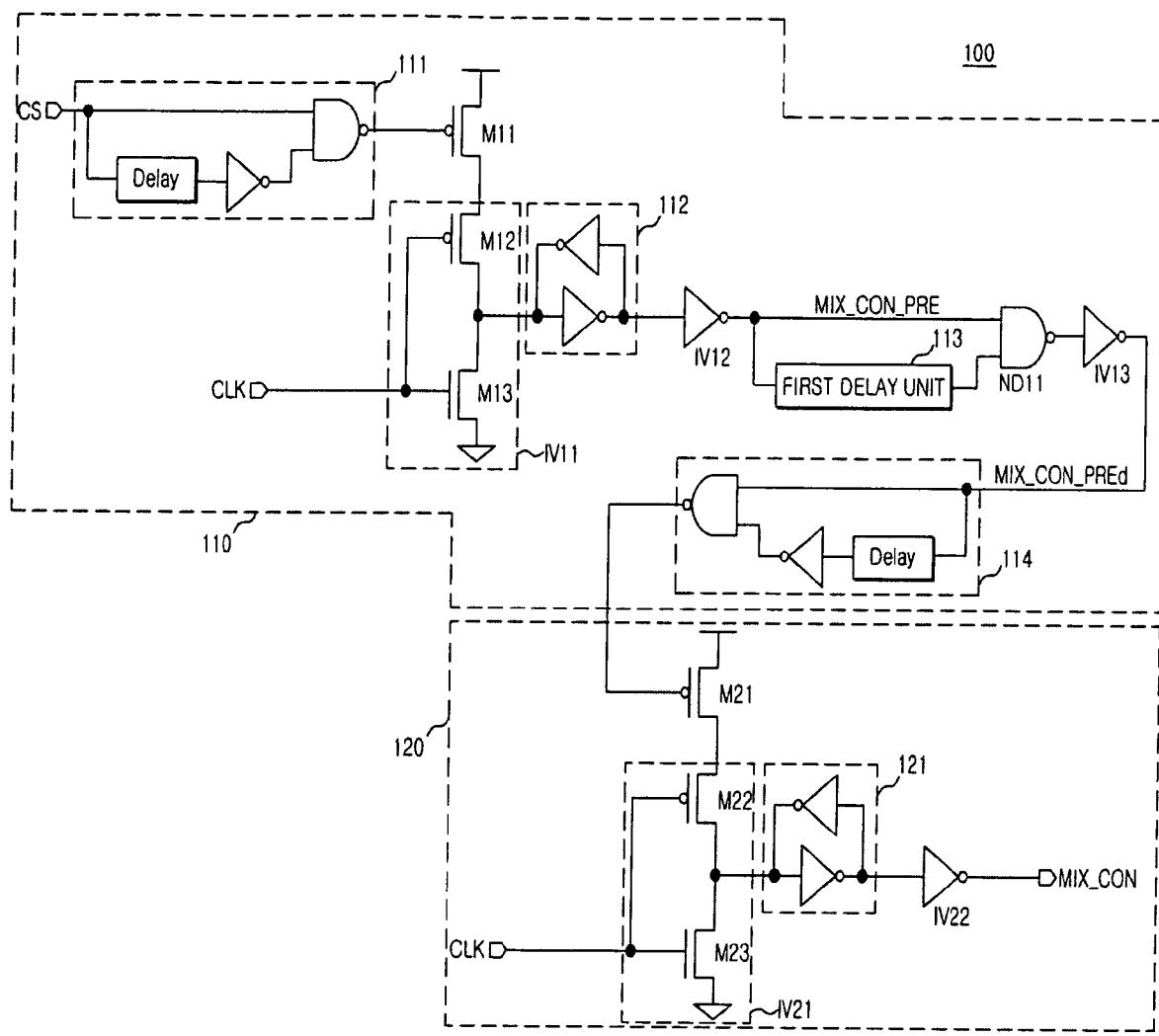
FIG. 4 is a circuit diagram illustrating the internal configuration of an operational mode control unit shown in FIG. 3.
Figure 5:
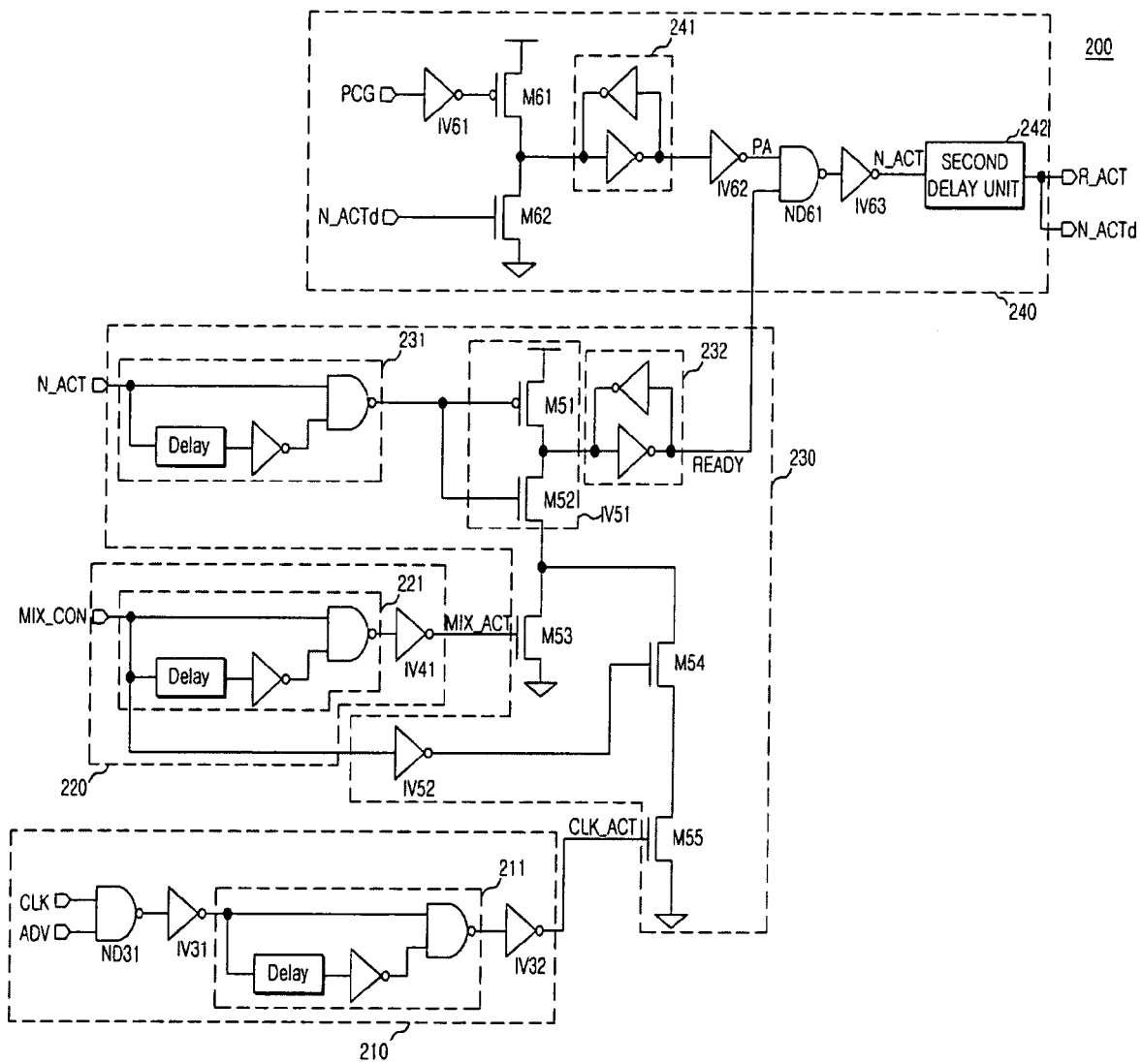
FIG. 5 is a circuit diagram illustrating the internal configuration of an active control unit shown in FIG. 3.
Figure 6:
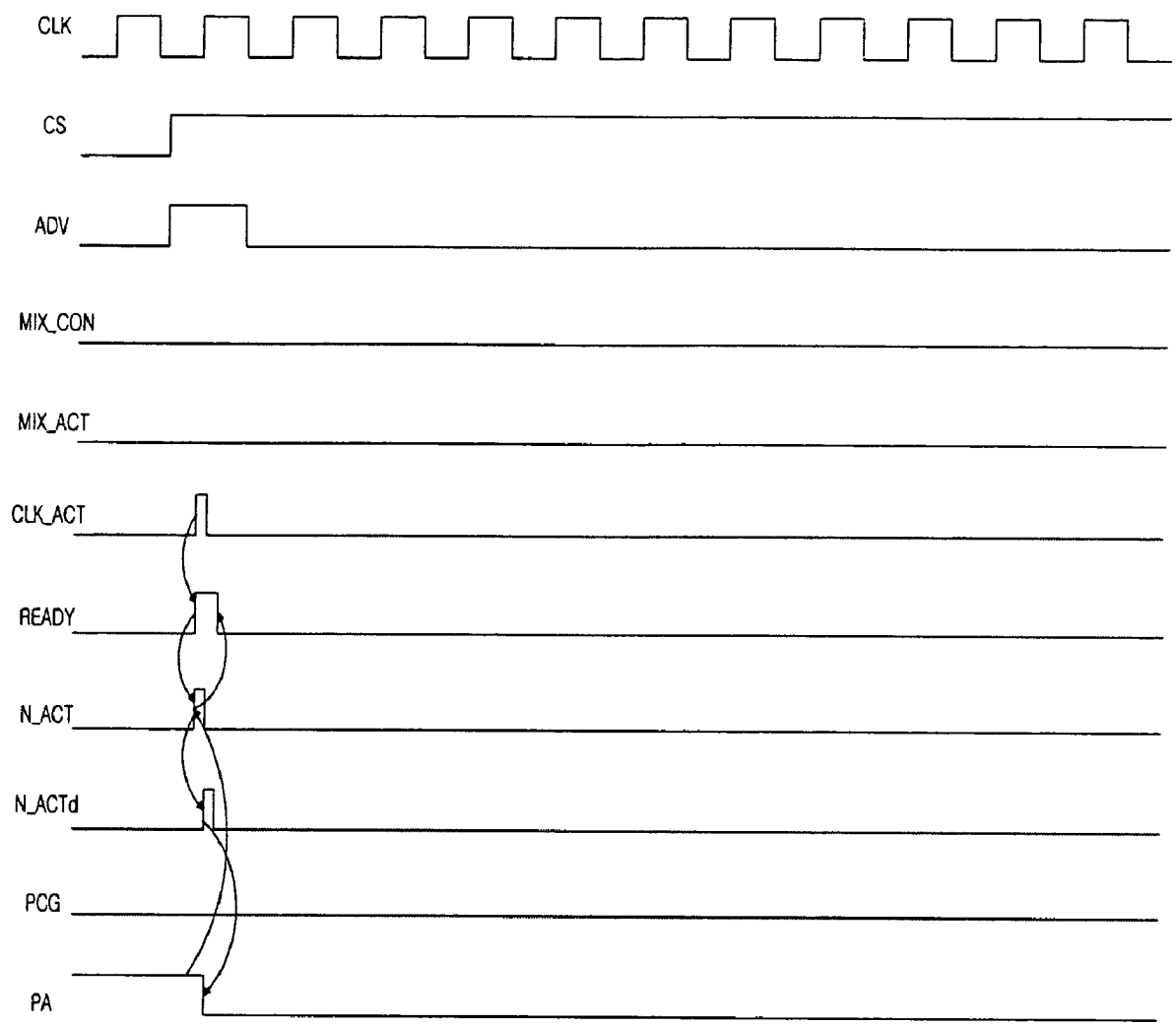
FIGS. 6 and 7 are timing charts illustrating the waveforms of signals of components according to an embodiment of the present invention.
Figure 7:
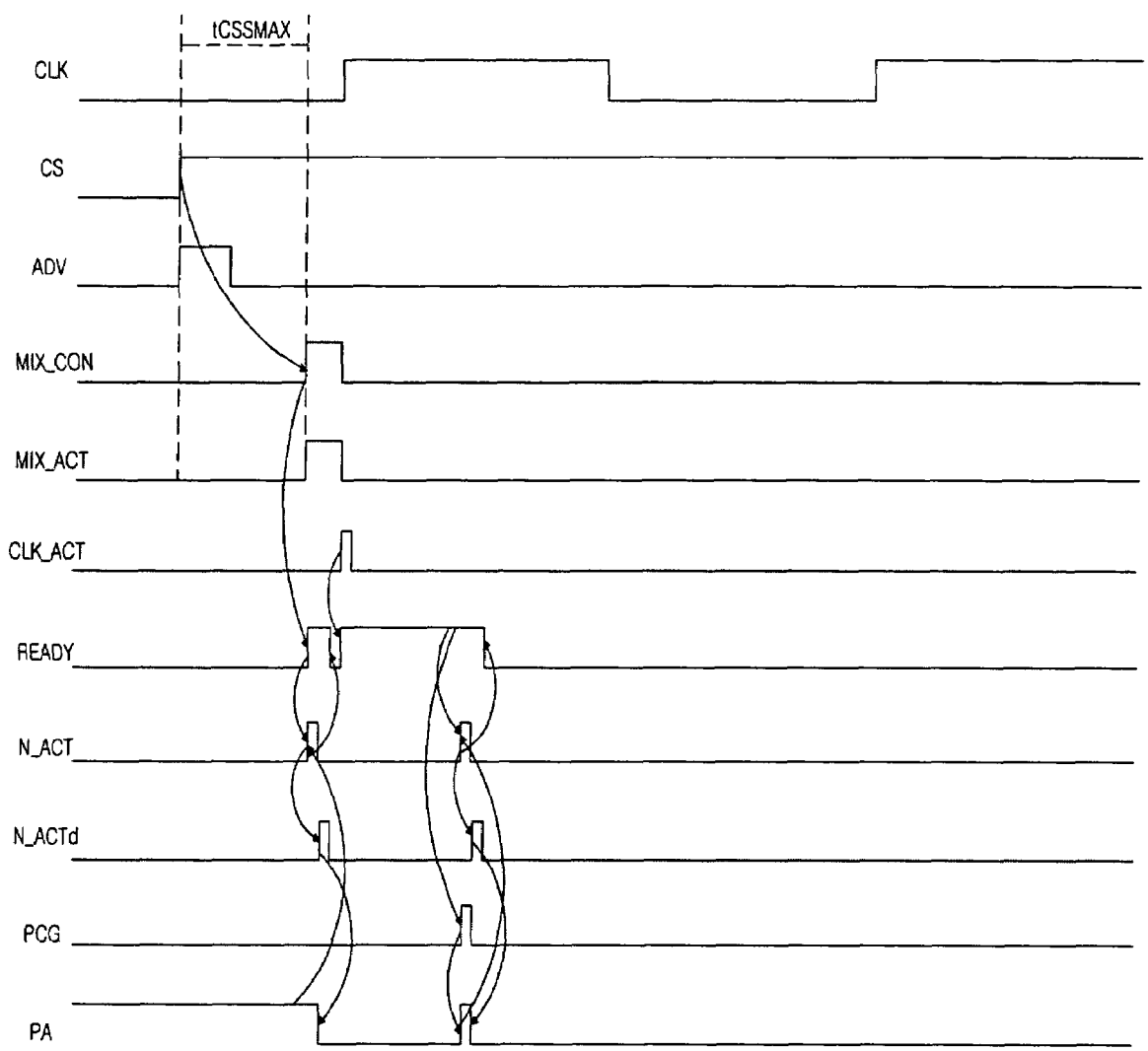

FIG. 3 is a block diagram illustrating the configuration of an apparatus for controlling an active cycle of semiconductor memory apparatus according to an embodiment of the invention. FIG. 4 is a circuit diagram illustrating the internal configuration of an operational mode control unit shown in FIG. 3. FIG. 5 is a circuit diagram illustrating the internal configuration of an active control unit shown in FIG. 3. FIGS. 6 and 7 are timing charts illustrating the waveforms of signals of components according to an embodiment of the present invention.

As shown in FIG. 3, the apparatus for controlling an active cycle of semiconductor memory apparatus includes an operational mode control unit 100 that determines the operational mode of the semiconductor memory apparatus and outputs an operational mode determination signal on the basis of a clock signal, and an active control unit 200 that controls the output of an active signal for executing an active cycle of a corresponding operational mode on the basis of the operational mode determination signal.

Referring to FIG. 4, the operational mode control unit 100 includes a determination unit 110 that outputs a preliminary operational mode determination signal MIX_CON_PRE on the basis of a chip selection signal CS and a clock signal CLK, and a signal output unit 120 that outputs an operational mode determination signal MIX_CON on the basis of the preliminary operational mode determination signal MIX_CON_PRE and the clock signal CLK.

The determination unit 110 includes a first pulse generating unit 111 that receives the chip selection signal CS, a first transistor M11 having a source connected to a power supply terminal and a gate connected to an output terminal of the first pulse generating unit 111, a first inverter IV11 that includes two transistors having gates to which the clock signal CLK is input and is connected between the first transistor M11 and a ground terminal, a first latch 112 that is connected to an output terminal of the first inverter IV11, a second inverter IV12 that is connected to an output terminal of the first latch 112, a first delay unit 113 that is connected to the second inverter IV12, a first NAND gate ND11 to which the output of the second inverter IV12 and the output of the first delay unit 113 are input, a third inverter IV13 to which the output of the first NAND gate ND11 is input, and a second pulse generating unit 114 that receives the output of the third inverter IV13.

The first delay unit 113 is configured to have the same delay time as a maximum value tCSSMAX of setup time. In this case, in the semiconductor memory apparatus supporting two operational modes, that is, a synchronous mode and an asynchronous mode, the setup time is settled to determine whether to input the clock signal CLK to perform the synchronous mode after the chip selection signal CS is enabled.

The first and second pulse generating units 111 and 114 output low pulses when high-level signals are input.

The signal output unit 120 includes a fourth transistor M21 having a source connected to the power supply terminal and a gate to which the preliminary operational mode determination signal MIX_CON_PRE is input, a fourth inverter IV21 that includes two transistors having gates to which the clock signal is input and is connected between the fourth transistor M21 and the ground terminal, a second latch 121 that is connected to an output terminal of the fourth inverter IV21, and a fifth inverter IV22 that is connected to an output terminal of the second latch 121.

Referring to FIG. 5, the active control unit 200 includes a synchronous active signal generating unit 210 that outputs a synchronous active signal CLK_ACT on the basis of the clock signal CLK and an effective address ADV, an asynchronous active signal generating unit 220 that outputs an asynchronous active signal MIX_ACT on the basis of the operational mode determination signal MIX_CON, a ready signal generating unit 230 that outputs a ready signal READY on the basis of a normal active signal N_ACT, the synchronous active signal CLK_ACT, and the asynchronous active signal MIX_ACT, and an active signal generating unit 240 that outputs a low active signal R_ACT and a delayed normal active signal N_ACTd on the basis of a pre-charge signal PCG, the delayed normal active signal N_ACTd, and the ready signal READY.

The synchronous active signal generating unit 210 includes a second NAND gate ND31 to which the clock signal CLK and the effective address ADV are input, a sixth inverter IV31 that receives the output of the second NAND gate ND31, a third pulse generating unit 211 that receives the output of the sixth inverter IV31, and a seventh inverter IV32 that receives the output of the third pulse generating unit 211.

The asynchronous active signal generating unit 220 includes a fourth pulse generating unit 221 to which the operational mode determination signal MIX_CON is input and an eighth inverter IV41 that receives the output of the fourth pulse generating unit 221.

The ready signal generating unit 230 includes a fifth pulse generating unit 231 to which the normal active signal N_ACT is input, a ninth inverter IV51 that receives the output of the fifth pulse generating unit 231, a ninth transistor M53 that is connected between the ninth inverter IV51 and the ground terminal and has a gate to which the asynchronous active signal MIX_ACT is input, a tenth inverter IV52 to which the operational mode determination signal MIX_CON is input, a tenth transistor M54 that is connected to a connection node of the ninth inverter IV51 and the ninth transistor M53 and has a gate to which the output of the tenth inverter IV52 is input, and an eleventh transistor M55 that is connected between the tenth transistor M54 and the ground terminal and has a gate to which the synchronous active signal CLK_ACT is input.

The third, fourth, and fifth pulse generating units 211, 221, and 231 output low pulses when high-level signals are input.

The active signal generating unit 240 includes an eleventh inverter IV61 to which the pre-charge signal PCG is input, a twelfth transistor M61 that has a source which is connected to the power supply terminal and has a gate to which the output of the eleventh inverter IV61 is input, a thirteenth transistor M62 that is connected between the twelfth transistor M61 and the ground terminal and has a gate to which the delayed normal active signal N_ACTd is input, a fourth latch 241 to which an output signal from a connection node of the twelfth transistor M61 and the thirteenth transistor M62 is input, a twelfth inverter IV62 that receives the output of the fourth latch 241, a third NAND gate ND61 to which the output of the twelfth inverter IV62 and the ready signal READY are input, and a thirteenth inverter IV63 that receives the output of the third NAND gate ND61, and a second delay unit. 242 that receives the output of the thirteenth inverter IV63.

Next, the operation of the apparatus for controlling an active cycle of semiconductor memory apparatus according to an embodiment of the invention will be described below with reference to FIGS. 3 to 7.

First, a case in which the clock signal CLK supplied to the semiconductor memory apparatus satisfies the maximum value tCSSMAX of the setup time will be described.

As shown in FIG. 6, when the chip selection signal CS is enabled, that is, turns to a high level, but the clock signal CLK is not input, that is, the clock signal CLK is at a low level, the determination unit 110 shown in FIG. 4 enables the preliminary operational mode determination signal MIX_CON_PRE, that is, the determination unit 110 changes the preliminary operational mode determination signal MIX_CON_PRE to a high level. Then, the preliminary operational mode determination signal MIX_CON_PRE is delayed by a time period corresponding to the maximum value tCSSMAX of the setup time, and is then input to the signal output unit 120 shown in FIG. 4.

That is, the first pulse generating unit 111 generates a low pulse to cause the first transistor M11 to be turned on. Since the clock signal CLK is at the low level, the first inverter IV11 outputs a high-level signal, and the preliminary operational mode determination signal MIX_CON_PRE changes to a high level by the first latch 112 and the second inverter IV12. As the preliminary operational mode determination signal MIX_CON_PRE changes to the high level, a low pulse delayed by the maximum value tCSSMAX is output through the first delay unit 113, the first NAND gate ND11, the third inverter IV13, and the second pulse generating unit 114.

The preliminary operational mode determination signal MIX_CON_PRE is a signal for ensuring the delay time of the first delay unit 113, that is, a timing margin corresponding to the maximum value tCSSMAX, in order to determine whether the clock signal CLK is input.

The low pulse output from the second pulse generating unit 114 of the determination unit 110 shown in FIG. 4 causes the signal output unit 120 shown in FIG. 4 to output the operational mode determination signal MIX_CON having a low level, as shown in FIG. 6.

That is, the fourth transistor M21 is turned on, and the clock signal CLK is toggled from a low level to a high level within the maximum value tCSSMAX of the setup time. Therefore, the low-level operational mode determination signal MIX_CON is output through the fourth inverter IV21, the second latch 121, and the fifth inverter IV22.

As the operational mode determination signal MIX_CON changes to the low level, the asynchronous active signal MIX_ACT having a low level is output from the asynchronous active signal generating unit 220 shown in FIG. 5, as shown in FIG. 6.

When the clock signal CLK is at the high level and the effective address ADV having a high level is input, a high-pulse synchronous active signal CLK_ACT is output from the synchronous active signal generator 210 shown in FIG. 5, which causes the ready signal generating unit 230 shown in FIG. 5 to output the ready signal READY at a high-level as shown in FIG. 6.

That is, since the synchronous active signal CLK_ACT is at the high level and the asynchronous active signal MIX_ACT is at the low level, the tenth transistor M54 and the eleventh transistor M55 of the ready signal generating unit 230 are turned on. In addition, since no active operation has been performed to cause the normal active signal N_ACT to be maintained at a disable status, that is, at a low level, the fifth pulse generating unit 231 outputs a high-level signal and thus the ninth inverter IV51 outputs a low-level signal, which causes the ready signal READY from the third latch 232 to be enabled, that is, to turn to a high level, as shown in FIG. 6.

The enabled ready signal READY causes the normal active signal N_ACT to be enabled, that is, to change to a high level in the active signal generating unit 240 shown in FIG. 5, and thus the row active signal R_ACT and the delayed normal active signal N_ACTd are enabled in the active signal generating unit 240, as shown in FIG. 6.

That is, since the ready signal READY is at the high level and PA output from the twelfth inverter IV62 is at a high level, the normal active signal N_ACT is enabled, that is, changes to a high level through the third NAND gate ND61 and the thirteenth inverter IV63, and the row active signal R_ACT and the delayed normal active signal N_ACTd are enabled through the second delay unit 242. At that time, PA turns to a high level by the pre-charge signal PCG, and turns to a low level by the delayed normal active signal N_ACTd. PA is kept at a high level until an active operation is performed, as shown in FIG. 6.

The high-level normal active signal N_ACT causes the ready signal READY to be disabled, that is, to turn to a low level in the ready signal generating unit 230, as shown in FIG. 6.

That is, since the normal active signal N_ACT is at the high level, the fifth pulse generating unit 231 outputs a low pulse, and thus the ready signal READY is disabled, that is, turns to a low level through the ninth inverter IV51 and the third latch 232. In this way, a synchronous active cycle is completed.

Meanwhile, when the high-level clock signal CLK is input at a point of time when the chip selection signal CS turns to a high level, that is, the chip selection signal CS is enabled, the signal output unit 120 outputs the operational mode determination signal MIX_CON having a low level, regardless of the determination unit 110 shown in FIG. 4. Subsequently, the synchronous active signal CLK_ACT from the synchronous active signal generating unit 210 shown in FIG. 5 is enabled, that is, turns to a high level, thereby performing a synchronous active cycle, which is identical with the synchronous active cycle described with reference to FIG. 6.

Next, a case in which the clock signal CLK supplied to the semiconductor memory apparatus does not satisfy the maximum value tCSSMAX of the setup time will be described.

That is, when the clock signal CLK not satisfying the maximum value tCSSMAX is input, the clock signal CLK is not toggled to a high level, that is, the clock signal CLK is kept at a low level even at the time when the effective address ADV is at the high level. Therefore, the operational mode determination signal MIX_CON turns to a high level, and thus the asynchronous active signal MIX_ACT is enabled, that is, turns to a high level, as shown in FIG. 7, which causes an asynchronous active cycle to be executed.

When the clock signal CLK is toggled to a high level after the maximum value tCSSMAX of the setup time, the synchronous active signal CLK_ACT is enabled, that is, turns to a high level, as shown in FIG. 7, which causes a synchronous active cycle to be executed.

In the related art, when the chip selection signal CS is enabled, an asynchronous active cycle is immediately executed. Then, when the clock signal CLK is input within the setup time, a synchronous active cycle is executed.

However, in disclosed embodiment of the invention, when the clock signal CLK is input within a timing margin obtained by delaying the operational mode determination signal for executing an asynchronous active cycle by the maximum value tCSSMAX, only the synchronous active cycle is executed. Meanwhile, when the clock signal CLK is not input within the maximum value tCSSMAX of the setup time, the asynchronous active cycle is executed. And when the clock signal CLK is input after the maximum value tCSSMAX of the setup time, the synchronous active cycle is executed.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

The apparatus and method for controlling an active cycle of semiconductor memory according to an embodiment of the present invention may have the following effects.

First, an unnecessary asynchronous active cycle is not executed by using the setup time, which makes it possible to improve an operational speed and to reduce current consumption.

Second, even when a clock signal supplied from the outside does not satisfy the setup time, it is possible to execute a normal active cycle and thus to improve the stability and reliability of a product.

What is claimed is:

1. An apparatus for controlling an active cycle of semiconductor memory apparatus supporting a synchronous mode and an asynchronous mode, comprising:
    an operational mode control unit configured to determine an operational mode of the semiconductor memory apparatus based on a clock signal for a predetermined time and to output an operational mode determination signal; and
    an active control unit configured to control the output of an active signal for executing an active cycle of the corresponding operational mode based on the operational mode determination signal,
    wherein the operational mode control unit is configured to determine the operational mode as an asynchronous mode when the clock signal is not inputted until the predetermined time lapses.

2. The apparatus of claim 1,
wherein the operational mode control unit includes:
a determination unit configured to output a preliminary operational mode determination signal for the predetermined time based on a chip selection signal and the clock signal, and
a signal output unit configured to output the operational mode determination signal based on the preliminary operational mode determination signal and the clock signal.

3. The apparatus of claim 2,
wherein, when the chip selection signal is enabled and the clock signal is not input within the predetermined time, the determination unit changes the preliminary operational mode determination signal to a potential level for allowing the semiconductor memory apparatus to be operated in the asynchronous mode.

4. The apparatus of claim 2,
wherein the determination unit includes:
a first pulse generating unit having an input to receive the chip selection signal and an output,
a first transistor having a source connected to a power supply terminal and a gate connected to the output of the first pulse generating unit,
a first inverter including an output, a gate to which the clock signal is input and is connected between the first transistor and a ground terminal,
a latch having an input connected to the output of the first inverter and having an output,
a second inverter having an input connected to the output of the latch and having an output,
a delay unit connected to the second inverter,
a NAND gate having inputs coupled to the output of the second inverter and the output of the delay unit and having an output,
a third inverter having an input coupled to the output of the NAND gate and having an output, and
a second pulse generating unit having an input coupled to the output of the third inverter.

5. The apparatus of claim 4,
wherein a delay time of the delay unit is equal to a maximum value of a setup time of the chip selection signal.

6. The apparatus of claim 2,
wherein the first and second pulse generating units output low pulses in response to level of input signals.

7. The apparatus of claim 2,
wherein, when the preliminary operational mode determination signal is enabled and the clock signal is not input, the signal output unit changes the operational mode determination signal to a potential level for allowing the semiconductor memory apparatus to be operated in the synchronous mode, and
when the clock signal is input, the signal output unit changes the operational mode determination signal to a potential level for allowing the semiconductor memory apparatus to be operated in the asynchronous mode.

8. The apparatus of claim 2,
wherein the signal output unit includes:
a transistor having a source connected to the power supply terminal and a gate to which the preliminary operational mode determination signal is input,
a first inverter including an output and a gate to which the clock signal is input and is connected between the transistor and the ground terminal,
a latch having an input connected to the output of the first inverter and an output, and
a second inverter having an input connected to the output of the latch.

9. The apparatus of claim 1,
wherein the active control unit includes:
a synchronous active signal generating unit configured to output a synchronous active signal based on the clock signal and an effective address,
an asynchronous active signal generating unit configured to output an asynchronous active signal based on the operational mode determination signal,
a ready signal generating unit configured to output a ready signal based on a normal active signal, the synchronous active signal, and the asynchronous active signal, and
an active signal generating unit configured to output an active signal based on a pre-charge signal, the normal active signal, and the ready signal.

10. The apparatus of claim 9,
wherein the synchronous active signal generating unit includes:
a NAND gate having an output and inputs to receive the clock signal and the effective address,
a first inverter having an output and an input coupled to the output of the NAND gate,
a pulse generating unit having an output and an input coupled to the output of the first inverter, and
a second inverter having an input coupled to the output of the pulse generating unit.

11. The apparatus of claim 10,
wherein the pulse generating unit outputs a low pulse in response to a level of input signal.

12. The apparatus of claim 9,
wherein the asynchronous active signal generating unit includes:
a pulse generating unit having an output and an input to receive the operational mode determination signal, and
an inverter having an input coupled to the output of the pulse generating unit.

13. The apparatus of claim 12,
wherein the pulse generating unit outputs a low pulse in response to a level of input signal.

14. The apparatus of claim 9,
wherein the ready signal generating unit includes:
a pulse generating unit having an output and an input to receive the normal active signal,
a first inverter having an input coupled to the output of the pulse generating unit,
a first transistor connected between the first inverter and the ground terminal and has a gate to which the asynchronous active signal is input,
a second inverter having an output and an input to receive the operational mode determination signal,
a second transistor connected to a connection node of the first inverter and the first transistor and having a gate to which the output of the second inverter is input, and
a third transistor connected between the second transistor and the ground terminal and having a gate to which the synchronous active signal is input.

15. The apparatus of claim 14,
wherein the pulse generating unit outputs a low pulse in response to a level of input signal.

16. The apparatus of claim 9,
wherein the active signal generating unit includes:
a first inverter having an output and an input to receive the pre-charge signal,
a first transistor connected to the power supply terminal and has a gate to which the output of the first inverter is input, a second transistor connected between the first transistor and the ground terminal and having a gate to which a delayed normal active signal is input,
a latch having an output and an input an output from a connection node of the first transistor and the second transistor is input,
a second inverter having an output and an input coupled to the output of the latch,
a NAND gate having an output and inputs to receive the output of the second inverter and the ready signal,
a third inverter having an output and an input coupled to the output of the NAND gate, and
a delay unit having an input coupled to the output of the third inverter.

17. A method of controlling an active cycle of semiconductor memory apparatus supporting a synchronous mode and an asynchronous mode, the method comprising:
determining an operational mode of the semiconductor memory based on a clock signal for a predetermined time and outputting an operational mode determination signal; and
executing one of a synchronous active cycle and an asynchronous active cycle on the basis of the operational mode determination signal,
wherein the determining the operational mode includes determining the operational mode as an asynchronous mode when the clock signal is not inputted until the predetermined time lapses.

18. The method of claim 17,
wherein the outputting of the operational mode determining signal includes:
when a chip selection signal is enabled, determining whether the clock signal is input, and outputting a preliminary operational mode determination signal, and
delaying the preliminary operational mode determination signal by the predetermined time, determining whether the clock signal is input within the predetermined time, and outputting the operational mode determination signal.

19. The method of claim 17,
wherein the predetermined time is a maximum value of a setup time of the chip selection signal.

20. The method of claim 18,
wherein the outputting of the preliminary operational mode determination signal includes:
when the clock signal is not input, determining the current operational mode as the asynchronous mode, and enabling the preliminary operational mode determination signal, and
when the clock signal is input, determining the current operational mode as the synchronous mode, and disabling the preliminary operational mode determination signal.

21. The method of claim 18,
wherein the outputting of the operational mode determination signal includes:
when the clock signal is not input, determining the current operational mode as the asynchronous mode, and enabling the operational mode determination signal, and
when the clock signal is input, determining the current operational mode as the synchronous mode, and disabling the operational mode determination signal.

22. A method of controlling an active cycle of semiconductor memory apparatus supporting a synchronous mode and an asynchronous mode, the method comprising:
when a chip selection signal is enabled, determining whether a clock signal is input, and outputting a preliminary operational mode determination signal;
delaying the preliminary operational mode determination signal by a predetermined time, determining whether the clock signal is input within the predetermined time, and outputting an operational mode determination signal; and
executing at least one of a synchronous active cycle and an asynchronous active cycle based on the operational mode determination signal.

23. The method of claim 22,
wherein the predetermined time is a maximum value of a setup time of the chip selection signal.

24. The method of claim 22,
wherein the outputting of the preliminary operational mode determination signal includes:
when the clock signal is not input, determining the current operational mode as the asynchronous mode, and enabling the preliminary operational mode determination signal, and
when the clock signal is input, determining the current operational mode as the synchronous mode, and disabling the preliminary operational mode determination signal.

25. The method of claim 22,
wherein the outputting of the operational mode determination signal includes:
when the clock signal is not input, determining the current operational mode as the asynchronous mode, and enabling the operational mode determination signal, and
when the clock signal is input, determining the current operational mode as the synchronous mode, and disabling the operational mode determination signal.

26. The method of claim 22,
wherein the executing of at least one of the synchronous active cycle and the asynchronous active cycle on the basis of the operational mode determination signal includes:
when the current operational mode is determined as the asynchronous mode based on the operational mode determination signal, executing the asynchronous active cycle, and
when the clock signal is input after the asynchronous active cycle is executed, executing the synchronous active cycle on the basis of the clock signal.

* * * * *